United States Patent
Kido et al.

(10) Patent No.: US 9,653,688 B2
(45) Date of Patent: *May 16, 2017

(54) ORGANIC DEVICES, ORGANIC ELECTROLUMINESCENT DEVICES AND ORGANIC SOLAR CELLS

(71) Applicants: Junji Kido, Yamagata-ken (JP); Mitsubishi Heavy Industries, Ltd., Tokyo (JP); Rohm Co., Ltd., Kyoto (JP)

(72) Inventors: Junji Kido, Yamagata-ken (JP); Toshio Matsumoto, Kanagawa-ken (JP); Takeshi Nakada, Kanagawa-ken (JP)

(73) Assignees: Junji Kido, Yamagata-ken (JP); Mitsubishi Heavy Industries, Ltd., Tokyo (JP); ROHM Co., Ltd., Kyoto (JP)

( * ) Notice: Subject to any disclaimer, the term of this patent is extended or adjusted under 35 U.S.C. 154(b) by 59 days.

This patent is subject to a terminal disclaimer.

(21) Appl. No.: 14/275,087

(22) Filed: May 12, 2014

(65) Prior Publication Data
US 2014/0346479 A1 Nov. 27, 2014

Related U.S. Application Data

(60) Continuation of application No. 13/349,986, filed on Jan. 13, 2012, now Pat. No. 8,723,025, which is a (Continued)

(30) Foreign Application Priority Data

Jul. 8, 2004 (JP) .................................. 2004-202266

(51) Int. Cl.
*H01L 51/50* (2006.01)
*H01L 51/00* (2006.01)
(Continued)

(52) U.S. Cl.
CPC ........ *H01L 51/006* (2013.01); *H01L 51/0051* (2013.01); *H01L 51/0058* (2013.01);
(Continued)

(58) Field of Classification Search
CPC ............. H01L 51/0051; H01L 51/5056; H01L 51/0078; H01L 51/0081; H01L 51/0084;
(Continued)

(56) References Cited

U.S. PATENT DOCUMENTS 6,013,384 A * 1/2000 Kido et al. .................... 428/690
6,084,176 A * 7/2000 Shiratsuchi et al. .......... 136/263
(Continued)

FOREIGN PATENT DOCUMENTS

EP 1722602 A1 11/2006
WO 2004018587 A1 3/2004

OTHER PUBLICATIONS

Tokito et al., "Metal oxides as a hole-injecting layer for an organic electroluminescent device", J. Phys. D: Appl. Phys. 29 (1996) 2750-2753.*
(Continued)

*Primary Examiner* — Golam Mowla
(74) *Attorney, Agent, or Firm* — McCormick, Paulding & Huber LLP

(57) ABSTRACT

An organic device, including an organic compound having charge-transporting ability (i.e., transporting holes and/or electrons) and/or including organic light emissive molecules capable of emitting at least one of fluorescent light or phosphorescent light, has a charge transfer complex-contained layer including a charge transfer complex formed upon contact of an organic hole-transporting compound and molybdenum trioxide via a manner of lamination or mixing thereof, so that the organic hole-transporting compound is in
(Continued)

a state of radical cation (i.e., positively charged species) in the charge transfer complex-contained layer.

2 Claims, 5 Drawing Sheets

Related U.S. Application Data division of application No. 11/177,071, filed on Jul. 7, 2005, now Pat. No. 8,101,857.

(51) Int. Cl.
    *H01L 51/52*     (2006.01)
    *H01L 51/44*     (2006.01)
    *H01L 51/42*     (2006.01)

(52) U.S. Cl.
    CPC ........ *H01L 51/0084* (2013.01); *H01L 51/441* (2013.01); *H01L 51/506* (2013.01); *H01L 51/5056* (2013.01); *H01L 51/5076* (2013.01); *H01L 51/5088* (2013.01); *H01L 51/5215* (2013.01); *H01L 51/5221* (2013.01); *H01L 51/5234* (2013.01); *H01L 51/0078* (2013.01); *H01L 51/0081* (2013.01); *H01L 51/42* (2013.01); *H01L 51/4206* (2013.01); *H01L 2251/5353* (2013.01); *Y02E 10/542* (2013.01); *Y02E 10/549* (2013.01); *Y10S 428/917* (2013.01)

(58) Field of Classification Search
    CPC ............. H01L 51/4206; H01L 51/5088; H01L 51/506; H01L 51/5076; H01L 51/5215; H01L 51/5234; H01L 51/441; H01L 51/5221; H01L 51/0058; H01L 51/42; H01L 51/006
    See application file for complete search history.

(56) References Cited

U.S. PATENT DOCUMENTS

| | | |
|---|---|---|
| 2003/0111666 A1 | 6/2003 | Nishi |
| 2003/0185977 A1 | 10/2003 | Kalynushkin |
| 2003/0189401 A1* | 10/2003 | Kido et al. .................... 313/504 |
| 2004/0046500 A1 | 3/2004 | Stegamat |

OTHER PUBLICATIONS

Bulovic, V.; Burrows, P.E.; Thompson, M.E.; Forrest, S.R., "Surface-Emitting Vacuum-Deposited Organic Light Emitting Device", Nov. 10, 1997, pp. 369-370.
European Search Report dated Feb. 24, 2014.

* cited by examiner

ORGANIC DEVICES, ORGANIC ELECTROLUMINESCENT DEVICES AND ORGANIC SOLAR CELLS

CROSS REFERENCE TO RELATED APPLICATIONS

This application is a continuation of U.S. patent application Ser. No. 13/349,986 filed on Jan. 13, 2012 and of U.S. patent application Ser. No. 11/177,071 filed on Jul. 7, 2005, which is entitled to the benefit of and incorporates by reference essential subject matter disclosed in Japanese Patent Application No. 2004-202266 filed on Jul. 8, 2004. All of the aforementioned patent applications are hereby expressly incorporated herein by reference.

BACKGROUND OF THE INVENTION

1. Field of the Invention

The present invention relates to an organic device, an organic electroluminescent device (hereinafter, abbreviated as an "organic EL device") and an organic solar cell each using an organic charge-transporting compound.

2. Background Art

In recent years, organic semiconductors and organic conductive materials have been actively studied, and in particular, remarkable process has been achieved in organic EL devices which are light emissive elements that use an organic semiconductor.

In organic EL devices, Tang et al. have successfully discovered, with regard to the increase in efficiency of EL devices, that high luminance and high efficiency sufficient for practical use such as a luminance of 1,000 cd/m$^2$ and external quantum efficiency of 1% at an applied DC voltage of not more than 10V can be obtained if a laminate structure of organic compounds having different carrier transporting properties (organic hole-transporting compounds and organic electron-transporting compounds) are applied to EL devices so that a balanced injection of holes and electrons from an anode and a cathode, respectively, is attained, and also a thickness of the organic layer sandwiched between the cathode and the anode is controlled to not more than 2,000 Å (cf. Tang et al., Appl. Phys. Lett., Vol. 51, p913 (1987); Japanese Laid-open Patent Application Nos. 59-194393, 63-264692 and 2-15595; and U.S. Pat. Nos. 4,539,507, 4,769,292 and 4,885,211).

Tang et al., also in an organic solar cell, achieved a power conversion efficiency of about 1% by laminating organic compounds having different carrier transporting properties (CuPc which is an organic hole-transporting compound and PV which is an organic electron-transporting compound) (Appl. Phys. Lett., 48, 183 (1986)).

More recently, new ideas for increasing the efficiency of aforementioned organic devices by stacking two or more units (i.e., by connecting the units in series), each of which units corresponds to the portion having been sandwiched by electrodes in prior art technology, have been published in various papers and patent publications (cf. Appl. Phys. Lett., Vol. 80, 1667 (2002), Chemistry Letters., pp. 327-330, Japanese Laid-open Patent Application No. 11-329748; U.S. Pat. No. 6,337,492; and Japanese Laid-open Patent Application Nos. 2003-45676 and 2003-264085).

In particular, the inventors of the present invention have disclosed a method of connecting two or more organic light emissive units using an electrically insulating charge generation layer (CGL) having a resistivity (specific resistance) of not less than 10$^2$ Ωcm in Japanese Laid-open Patent Application No. 2003-272860, and named the resulting device an "organic MPE (Multi-Photon Emission) EL device". The MPE devices have been discussed and exhibited in various conferences and exhibitions so far, and obtained high appraisal (cf. 49th lecture meeting, Associate of Society of Applied Physics and others, Preprint 27p-YL-3, p. 1308; 63rd lecture meeting, Society of Applied Physics, preprint 27a-ZL-12, p. 1165; Proceedings of EL2002 (International Conference on the Science and Technology of Emissive Device and Lighting), p. 539; Proceedings of IDMC'03 (International Display Manufacturing Conference), Fr-21-01, p. 413; SID03 DIGEST, Vol. XXXIV, BOOKII, p. 964; SID03 DIGEST, Vol. XXXIV, BOOKII, p. 979; 13th lecture meeting, Production Technology Exhibition of Flat Panel Display, D-4 (2003); exhibition and distribution materials concerning white light emission device by IMES Co., Ltd. at LCD/PDP International 2002, EExpress (Nov. 15, 2002), exhibition and distribution materials concerning white light emission device by IMES Co., Ltd. at FPD International 2003, and L. S. Liao et al., Appl. Phys. Lett., Vol. 84, p. 167 (2004)).

Said charge generation layer in the MPE device has a similar structure; such that compositions of carrier (i.e., electrons and/or holes) injection layers (contacting anode or cathode), which the inventors of the present invention have introduced and developed, are laminated in sequence. Specifically, there is provided a laminated structure having, in sequence, the layer containing radical anion state of electron accepting (i.e., electron transporting) organic molecule, which are disclosed in Japanese Laid-open Patent Application Nos. 10-270171 (U.S. Pat. No. 6,013,384), 2001-102175 (U.S. Pat. No. 6,589,673), 11-233262 (European Patent No. 0936844B1) and 2000-182774 (U.S. Pat. No. 6,396,209), and the layer containing radical cation state of hole transporting organic molecule resulting from being oxidized by a strong electron accepting compound, for example, an inorganic compound such as FeCl3 and V$_2$O$_5$ or an organic compound such as F$_4$-TCNQ (tetrafluoro-tetracyanoquinodimethane) and PNB (tris-β-(pentafluoronaphthyl)borane), which are disclosed in Japanese Laid-open Patent Application Nos. 11-251067 (U.S. Pat. No. 6,423,429), 2001-244079 (U.S. Pat. No. 6,589,673) and 2003-272860 and Japanese Patent Application No. 2003-358402.

Said laminated charge generation layer (CGL) composed of a layer including radical anions and a layer including radical cations can be termed "a hole current-electron current conversion layer". In particular, among the several candidates for the laminated structure possible to achieve that conversion, the method disclosed in Japanese Patent Application No. 2003-380338 by the inventors of the present invention was found to be ideal for the serial connection of the multiple organic EL devices. For the energy barrier for electron transfer within that conversion layer (i.e., CGL) is diminished when the method is employed.

Furthermore, among the above-described technology concerning the layer including radical cation state molecules, a layer including a charge transfer complex produced upon an oxidation-reduction reaction between V$_2$O$_5$ and an organic hole-transporting compound (contacting each other by laminating or mixing these two compounds), was found to be most useful with respect to chemical and/or thermal stability.

However, V$_2$O$_5$ is categorized as a deleterious substance, and further, does not have a sufficient light transmissivity. So, the inventors of the present invention have now found that MoO$_3$ (molybdenum trioxide) is notably superior to V$_2$O$_5$ with regard to the safety and the light transmissivity.

Note that use of MoO$_3$ as a constituent of an organic EL device is described in the following references, for example:

Japanese Laid-open Patent Application No. 11-67459 (Reference 1), Japanese Laid-open Patent Application No. 11-61398 (Reference 2), Japanese Laid-open Patent Application No. 2000-235893 (Reference 3), Japanese Laid-open Patent Application No. 2000-306681 (Reference 4), Japanese Laid-open Patent Application No. 2000-223276 (Reference 5), Japanese Laid-open Patent Application No. 10-199681 (Reference 6), Japanese Patent No. 2824411 (Reference 7), and S. Tokito, K. Noda and Y. Taga, J. Phys. D: Appl. Phys. 29 (11) 2750-2753, November 1996 (Reference 8).

Among the references listed above, the technology described in Japanese Patent No. 2824411, i.e., Reference 7, is also described in Reference 8 which is the technical article.

Reference 7 teaches the deposition of a metal oxide such as vanadium oxide (VOx), ruthenium oxide (RuOx) and molybdenum oxide (MoOx) at a thickness of 50 to 300 Å on ITO anode by sputtering method in order to reduce an energy barrier for hole injection from ITO anode to an organic layer, thereby providing an organic EL device capable of being operated at a lower voltage in comparison with the prior art EL devices.

However, according to the Reference 7, a layer of molybdenum oxide has only a transmittance of 10% at a thickness of 2,150 Å, and thus its thickness is limited due to the reduced light transmissivity which is considered to be resulting from oxygen desorption during the sputtering process.

Moreover, Japanese Laid-open Patent Application No. 2000-223276 describes the use of a mixture of metal oxides having the composition of indium oxide/zinc oxide/molybdenum oxide (ratio=0.65/0.25/0.1) as a hole injection layer, in order to solve the drawback of the low transparency seen in the Japanese Patent No. 2824411. Stated otherwise, in Japanese Laid-open Patent Application No. 2000-223276, they addressed this drawback (with recognizing the opacity of that sputtered molybdenum oxide layer) to satisfy both of transparency and hole injection property requirements by mixing a metal oxide having a better transparency into the molybdenum oxide. Then, the hole injection layer (having the composition of indium oxide/zinc oxide/molybdenum oxide (ratio=0.65/0.25/0.1)) is also deposited by a high frequency (i.e., RF=radio frequency) magnetron sputtering method. Similar manners are also described in Japanese Laid-open Patent Application Nos. 11-67459 and 11-61398.

SUMMARY OF THE INVENTION

According to the invention, an organic device, including an organic compound having charge-transporting ability (i.e., transporting holes and/or electrons) and/or including organic light emissive molecules capable of emitting at least one of fluorescent light and phosphorescent light, has a charge transfer complex-contained layer including a charge transfer complex formed upon contact of an organic hole-transporting compound and molybdenum trioxide via a manner of lamination or mixing thereof, so that the organic hole-transporting compound is in a state of radical cation (i.e., positively charged species) in the charge transfer complex-contained layer.

The charge transfer complex-contained layer can be a hole-transporting layer contacting an anode.

The charge transfer complex-contained layer can be an interfacial layer disposed between two layers each consisting of hole-transporting molecules having different molecular structures for reducing the barrier height of the hole transfer between the two layers.

The charge transfer complex-contained layer can be a constituent of a hole current-electron current conversion layer formed by laminating the charge transfer complex-contained layer and the layer wherein the electron-transporting compound is in a state of radical anions (i.e., negatively charged species) generated via a radical anion generation means.

The hole current-electron current conversion layer can be a buffer layer that works as a damage reduction layer induced during the electrode formation process.

The organic device can be an organic electroluminescent device.

The organic device can be an organic solar cell.

According to the invention, in an embodiment, an organic electroluminescent device is provided, having a multi-photon emission (MPE) structure that includes at least two light emissive units, having a charge transporting organic molecules (i.e., transporting holes and/or electrons) and organic molecules consisting of fluorescent or phosphorescent dye capable of radiating light, and having the charge transfer complex-contained layer described above and the radical anion contained layer, also described above, thereby forming the hole current-electron current conversion layer working as a charge generation layer (CGL) in an aforementioned MPE organic EL device.

In an embodiment, a tandem-connection solar cell including at least two organic solar cell units, includes an organic charge-transporting compound (I.e., transporting holes and/or electrons) and a hole current-electron current conversion layer, formed by laminating the charge transfer complex-contained layer described above and the radical anion contained layer, also described above, working as a connector layer for connecting multiple organic solar cell units in series.

In an embodiment, an organic device is provided, having a layer structure on a substrate in the following deposition sequence: (A) an anode, (B) a layer structure mainly consisting of organic compounds (C) a radical anion-contained layer in which an organic electron-transporting molecule is in a state of radical anions generated by a radical anion generation means, (D) a cathode-adjacent layer of an MoO$_3$ layer, and (E) a cathode layer.

In an embodiment, an organic device is provided, having a layer structure on a substrate in the following deposition sequence: (A) an anode, (B) a layer structure mainly consisting of organic compounds (C) a radical anion-contained layer in which an organic electron-transporting molecule is in a state of radical anions generated by a radical anion generation means, (D) a cathode-adjacent layer consisting of a mixture of MoO$_3$ and an organic hole-transporting molecule, and (E) a cathode layer, wherein the laminated layer of (C) and (D) works as "hole current-electron current conversion layer".

In an embodiment, an organic device is provided, having a layer structure on a substrate in the following deposition sequence: (A) an anode, (B) a layer structure mainly consisting of organic compounds (C) a radical anion-contained layer in which an organic electron-transporting molecule is in a state of radical anions generated by a radical anion generation means, (D) a cathode-adjacent layer consisting of a mixture of MoO$_3$ and an organic hole-transporting molecule, and (E) a cathode layer, wherein the laminated layer of (C) and (D) works as "hole current-electron current conversion layer" as well as "damage reduction layer" to reduce the damage induced during the electrode deposition process.

In an embodiment, an organic electroluminescent device is a MPE organic EL device containing multiple light emissive units, wherein a layer structure on a substrate is provided in the following deposition sequence: (A) an anode, (B) a layer structure mainly consisting of organic compounds (C) a radical anion-contained layer in which an organic electron-transporting molecule is in a state of radical anions generated by radical anion generation means, (D) a cathode-adjacent layer consisting of a mixture of $MoO_3$ and an organic hole-transporting molecule, and (E) a cathode layer, wherein the laminated layer of (C) and (D) works as "hole current-electron current conversion layer" as well as "damage reduction layer" to reduce the damage induced during the electrode deposition process.

In an embodiment, an organic device is a tandem-connection solar cell including at least two organic solar cell units, wherein a layer structure on a substrate is provided in the following deposition sequence: (A) an anode, (B) a layer structure mainly consisting of organic compounds (C) a radical anion-contained layer in which an organic electron-transporting molecule is in a state of radical anions generated by a radical anion generation means, (D) a cathode-adjacent layer consisting of a mixture of $MoO_3$ and an organic hole-transporting molecule, and (E) a cathode layer, and the laminated portion of (C) and (D) is characteristic of the device.

In an embodiment, an organic device is provided, having a layer structure on a substrate in the following deposition sequence: (A) an anode, (B) an anode-adjacent layer consisting of $MoO_3$, (C) a layer of an organic hole-transporting compound, (D) a layer structure mainly consisting of organic compounds, and (E) a cathode layer, wherein "(B) an anode-adjacent layer consisting of $MoO_3$" is prepared via resistive heating method. And the interfacial layer between (B) and (C) layers is the charge transfer complex contained layer wherein the organic hole-transporting compound is in a state of radical cations, resulting from the contact of the $MoO_3$ in (B) and the organic hole-transporting compound in (C).

In an embodiment, an organic device is provided, having a layer structure on a substrate in the following deposition sequence: (A) an anode, (B) an anode-adjacent layer consisting of a mixture of $MoO_3$ and an organic hole-transporting molecule, (C) a layer structure mainly consisting of organic compounds, and (D) a cathode layer, wherein "(B) an anode-adjacent layer consisting of a mixture of $MoO_3$ and an organic hole-transporting molecule" is prepared via resistive heating method. And the $MoO_3$ and the organic hole-transporting molecule in the "(B) an anode-adjacent layer" forms the charge transfer complex, thus the organic hole-transporting molecule is in the state of radical cations, forming the charge transfer complex contained layer.

In an embodiment, an organic device is provided, having a layer structure on a substrate in the following deposition sequence: (A) a cathode layer, (B) a layer structure mainly consisting of organic compounds, (C) a layer of an organic hole-transporting compound, (D) an anode-adjacent layer consisting of $MoO_3$, and (E) an anode layer, wherein the "(D) an anode-adjacent layer consisting of $MoO_3$" is prepared via resistive heating method. And the interfacial layer between (C) and (D) layers is the charge transfer complex contained layer wherein the organic hole-transporting compound is in a state of radical cations, resulting from the contact of the organic hole-transporting compound in (C) and the $MoO_3$ in (D).

In an embodiment, an organic device is provided, having a layer structure on a substrate in the following deposition sequence: (A) a cathode layer, (B) a layer structure mainly consisting of organic compounds, (C) an anode-adjacent layer consisting of a mixture of $MoO_3$ and an organic hole-transporting molecule, and (D) an anode layer, wherein the "(C) an anode-adjacent layer consisting of a mixture of $MoO_3$ and an organic hole-transporting molecule" is prepared via resistive heating method. And the $MoO_3$ and the organic hole-transporting molecule in the "(C) an anode-adjacent layer" forms the charge transfer complex, thus the organic hole-transporting molecule is in the state of radical cations, forming the charge transfer complex contained layer.

DESCRIPTION OF THE PREFERRED EMBODIMENTS

Figure 1:
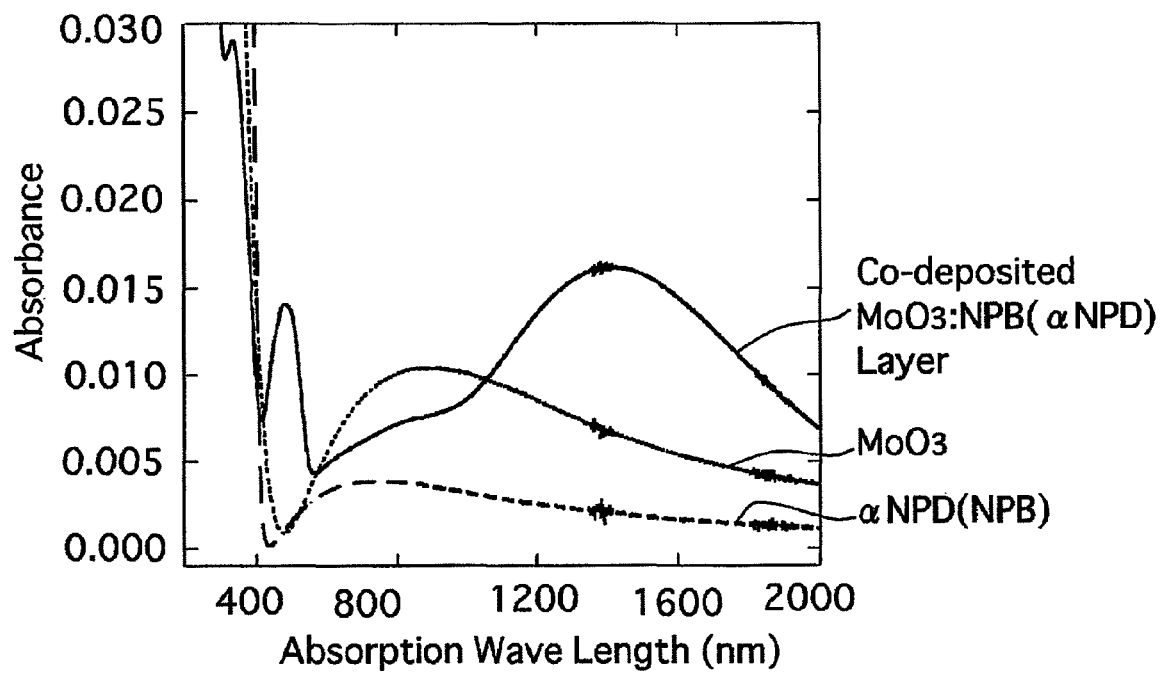
FIG. 1 is a graph showing the measurement results of the absorption spectrum of each of the layers described in Example 1 of the present invention.

Hereinafter, the present invention will be described in detail referring to the embodiments thereof.

First of all, $MoO_3$ (molybdenum trioxide) used in the present invention is prepared via resistive heating method. This is because the inventors of the present invention have found that if $MoO_3$ film is thus prepared, an oxygen desorption problem, often seen when a sputtering method is employed for the $MoO_3$ film preparation, is never observed, i.e., the stoichiometric composition of $MoO_3$ is successfully maintained during the thermal evaporation process (via the resistive heating method), leading to substantially transparent characteristics of the deposited $MoO_3$ film, which is theoretically expected. For $MoO_3$ itself is commercially available as white powder form.

The inventors have also found that when $MoO_3$ having a stoichiometric composition is deposited as a layer via resistive heating method, it can react with an organic hole-transporting compound (also recognized as an organic electron-donating compound) at molecular level, thereby forming a charge transfer complex. Namely, the present invention has almost the same content as the prior invention (by the inventor of this application), wherein the combination of $V_2O_5$ and an organic hole-transporting compound is basically used, but replaces that combination with that of $MoO_3$ and an organic hole-transporting compound so that more advantageous points $MoO_3$ has (compared with $V_2O_5$), like less toxic property ($MoO_3$ is not designated as "deleterious substance" like $V_2O_5$) and/or better transparency, can be obtained.

Accordingly, usage of $MoO_3$ disclosed in the present invention can be applied to all of the technology using electron-accepting substances (generally denoted as 'Lewis acid') having been disclosed by the inventors of the present invention. Namely, $MoO_3$ can be applied to all of the following:

1.) Embodiments in which a laminated layer or mixture layer consisting of the hole-transporting compound and $MoO_3$ is utilized as a hole injection layer (or a hole transporting layer) adjacent to an anode (technologies disclosed in Japanese Patent Application No. 2003-358402 and Japanese Laid-open Patent Application Nos. 11-251067 (U.S. Pat. No. 6,423,429) and 2001-244079 (U.S. Pat. No. 6,589, 673))

2.) Embodiments in which $MoO_3$ is included in an interface region separating two or more hole-transporting layers consisting of two or more different hole-transporting molecules to thereby utilize $MoO_3$ for diminishing a hole transfer barrier in the interface between the two different hole transporting layers (technologies disclosed in Japanese Patent Application No. 2003-384202)

3.) Embodiments in which a laminated layer or a mixture layer of the hole-transporting molecules and $MoO_3$ is utilized as a charge generation layer (CGL) of the multi-photon emission (MPE) organic EL device or as a connector layer of the tandem connection organic solar cell (technologies disclosed in Japanese Laid-open Patent Application No. 2003-272860 and Japanese Patent Application No. 2003-380338)

4.) Embodiments in which $MoO_3$ is utilized as a damage reduction buffer layer for reducing damage induced during formation of electrode layers (technologies disclosed in Japanese Patent Application No. 2003-380338)

5.) Embodiments in which a $MoO_3$-contained layer is utilized as an optical path length adjustment layer based on the characteristics thereof that the $MoO_3$-contained layer has a lower resistivity in different order of magnitude in comparison with a layer of the pure organic compound, along with excellent transparency (technologies disclosed in Japanese Laid-open Patent Application No. 2001-244079 (U.S. Pat. No. 6,589,673) and Japanese Patent Application No. 2003-380338).

Requirement (A)

According to the findings obtained by the inventors of the present invention so far, whether or not the $MoO_3$-contained layer can be applied to the technologies 1) to 5) described above can be confirmed by spectroscopic analysis, more specifically, by comparing the absorption spectrum of the mixture layer (consisting of $MoO_3$ and hole-transporting organic molecule) with that of pure hole-transporting compound and/or pure $MoO_3$ layer.

More specifically, although the absorption spectrum of $MoO_3$ or organic hole-transporting compound, if each solely employed, does not peak in a near-infrared region (around the wavelength of 800 to 2,000 nm), that of a mixture layer of $MoO_3$ and the organic hole-transporting compound has its peak in a near-infrared region (800 to 2,000 nm), and thus it clearly suggests the presence of an electron transfer between $MoO_3$ and the organic hole-transporting compound. Stated otherwise, $MoO_3$ and the organic hole-transporting compound can form a charge transfer complex via the oxidation-reduction reaction (donation and acceptance of electrons) between these compounds. In this process of the formation of the charge transfer complex, the organic hole-transporting compound is changed to a radical cation state, and thus it can move as an internal carrier in the mixture layer or can move into an organic layer (contacting that mixture layer), as well.

Requirement (B)

Furthermore, (in addition to the above-described spectroscopic analysis method), according to the findings obtained by the inventors of the present invention so far, whether or not the $MoO_3$-contained layer can be applied to the technologies 1) to 5) described above can be confirmed by the fact that the mixture layer exhibits a lower resistivity if the mixture ratio is properly selected, which could not be achieved with sole use of the compounds each constituting the mixture layer. This phenomenon clearly indicates that the two compounds (in the mixture layer) are not just physically blended, but they chemically react with each other leading to formation of a charge transfer complex accompanied with electron transfer between the compounds in the layer (charge transfer complex-contained layer).

The $MoO_3$-contained layer of the present invention can be applied to all of the embodiments 1) to 5), when the above-described requirements (A) and (B) are satisfied.

The organic hole-transporting compound used in the present invention is an arylamine compound, and the arylamine compound is preferably the one represented by the following general formula (I):

(Formula 1)

wherein Ar1, Ar2 and Ar3 each independently represents an aromatic hydrocarbon group which may have any substituents.

Examples of these arylamine compound include, but not restricted to, the arylamine compounds disclosed in Japanese Laid-open Patent Application Nos. 6-25659, 6-203963, 6-215874, 7-145116, 7-224012, 7-157473, 8-48656, 7-126226, 7-188130, 8-40995, 8-40996, 8-40997, 7-126225, 7-101911 and 7-97355. They include N,N,N',N'-tetraphenyl-4,4'-diaminophenyl, N,N'-diphenyl-N,N'-di(3-methylphenyl)-4,4'-diaminobiphenyl, 2,2-bis(4-di-p-tolylaminophenyl)propane, N,N,N',N'-tetra-p-tolyl-4,4'-diaminobiphenyl, bis(4-di-p-tolylaminophenyl)phenylmethane, N,N'-diphenyl-N,N'-di(4-methoxyphenyl)-4,4'-diaminobiphenyl, N,N, N',N'-tetraphenyl-4,4'-diaminodiphenylether, 4,4'-bis(diphenylamino)quadriphenyl, 4-N,N-diphenylamino-(2-diphenylvinyl)benzene, 3-methoxy-4'-N,N-diphenylaminostilbenzene, N-phenylcarbazole, 1,1-bis(4-di-p-triaminophenyl)cyclohexane, 1,1-bis(4-di-p-triaminophenyl)-4-phenylcyclohexane, bis(4-dimethylamino-2-methylphenyl)phenylmethane, N,N,N-tri(p-tolyl)amine, 4-(di-p-tolylamino)-4'-[4-(di-p-tolylamino) styryl]stilbene, N,N,N',N'-tetraphenyl-4,4'-diaminobiphenyl N-phenylcarbazole, 4,4'-bis[N-(1-naphthyl)-N-phenylamino]biphenyl, 4,4"-bis[N-(1-naphthyl)-N-phenylamino]p-terphenyl, 4,4'-bis[N-(2-naphtyl)-N-phenylamino]biphenyl, 4,4'-bis[N-(3-acenaphthenyl)-N-phenylamino]biphenyl, 1,5-bis[N-(1-naphthyl)-N-phenylamino]naphthalene, 4,4'-bis[N-(9-anthryl)-N-phenylamino]biphenyl, 4,4"-bis[N-(1-anthryl)-N- phenylamino]p-terphenyl, 4,4'-bis[N-(2-phenanthryl)-N-phenylamino]biphenyl, 4,4'-bis[N-(8-fluoranthenyl)-N-phenylamino]biphenyl, 4,4'-bis[N-(2-pyrenyl)-N-phenylamino]biphenyl, 4,4'-bis[N-(2-perylenyl)-N-phenylamino]biphenyl, 4,4'-bis[N-(1-coronenyl)-N-phenylamino]biphenyl, 2,6-bis(di-p-tolylamino)naphthalene, 2,6-bis[di-(1-naphthyl)amino]naphthalene, 2,6-bis[N-(1-naphthyl)-N-(2-naphthyl)amino]naphthalene, 4,4''-bis[N,N-di(2-naphthyl)amino]terphenyl, 4,4'-bis{N-phenyl-N-[4-(1-naphthyl)phenyl]amino}biphenyl, 4,4'-bis[N-phenyl-N-(2-pyrenyl)amino]biphenyl, 2,6-bis[N,N-di(2-naphthyl)amino]fluorene, 4,4''-bis(N,N-di-p-tolylamino)terphenyl, bis(N-1-naphthyl)(N-2-naphthyl)amine, 4,4'-bis[N-(2-naphthyl)-N-phenylamino]biphenyl (abbreviated as α-NPD or NPB(N,N'-Bis(naphthalen-1-yl)-N,N'-bis(phenyl)benzidine)) represented by the following formula:

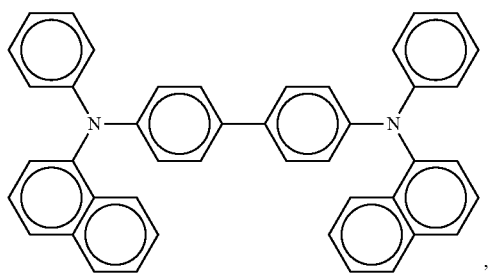

(Formula 2)

spiro-NPB represented by the following formula:

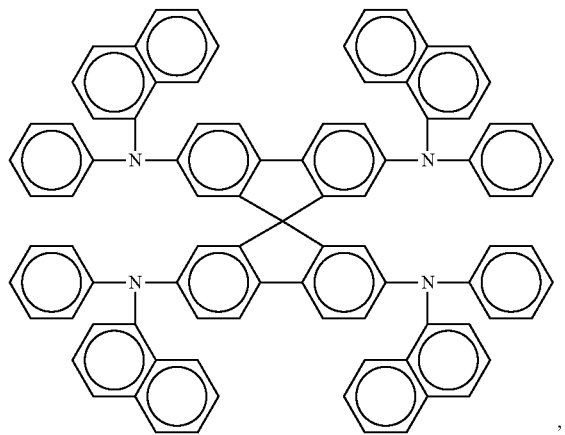

(Formula 3)

spiro-TAD (2,2'',7,7''-Tetrakis(diphenylamin)-9,9'-spirobifluoren) represented by the following formula:

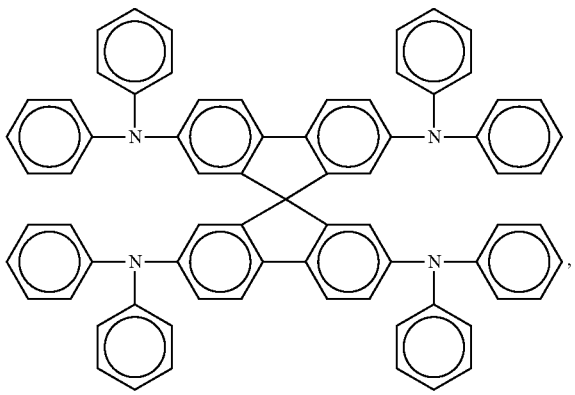

(Formula 4)

2-TNATA (4,4',4''-tris[N-(1-naphthyl)-N-phenylamino]-triphenylamine) represented by the following formula:
(Formula 5)

In addition, any well-known arylamine compounds used in the production of the conventional organic EL devices may be suitably used.

Moreover, it is desirable for the arylamine compound used herein to be an arylamine compound having a glass transition temperature of not lower than 90, from a point of view regarding thermal stability of the organic device. Examples of suitable arylamine compounds include α-NPD, spiro-NPB, spiro-TAD and 2-TNATA, described above, as they have a glass transition temperature of not lower than 90. Alternatively, the organic hole-transporting compound used in the present invention may be a pigment type organic compound. Furthermore, that organic hole-transporting compounds (of pigment typed) may be a porphyrin compound or derivatives thereof. Examples of the porphyrin compound include CuPc represented by the formula:

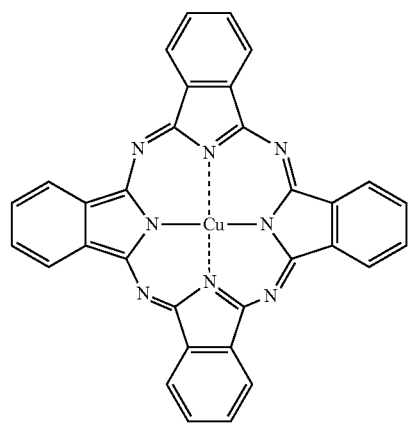

(Formula 6)

The organic hole-transporting compound (pigment typed) may be a quinacridone compound or derivatives thereof. The organic hole-transporting compound may be also an indanthrene compound or derivatives thereof.

Since the above-described organic hole-transporting compounds can satisfy any one of the above requirements (A) and (B), the above-described organic hole-transporting compounds can be used as a constituent in the $MoO_3$-contained layer.

EXAMPLES

The present invention will be further described with reference to the examples thereof. Note, however, that the present invention is not restricted to these examples.

Example 1

In Example 1, an absorption spectrum and its absorbance value (at layer thickness of 10 nm) was determined for each of the layers which are the main constituents of the present invention, i.e., a vacuum-deposited layer of $MoO_3$ (molybdenum trioxide), a vacuum-deposited layer of α-NPD (also abbreviated to NPB) as an organic hole-transporting compound and a co-deposited layer of $MoO_3$ and α-NPD ($MoO_3$:α-NPD=5:1, molar ratio).

Measurement results are plotted in FIG. 1. As can be understood from FIG. 1, prominent peaks could be observed in the region of around 500 nm and around 1,400 nm for the co-deposited layer of $MoO_3$ and α-NPD. These peaks could not be observed for each of the single layer of $MoO_3$ and the single layer of α-NPD, and clearly indicates the formation of a charge transfer complex as a result of the oxidation reduction reaction between these two substances, i.e., formation of radical cations ($NPB^+$) of NPB as the organic hole-transporting compound.

Example 2

In Example 2, the measurement of the resistivity of $MoO_3$ or the mixture layer, prepared by co-deposition of $MoO_3$ and the organic hole-transporting compound, was carried out while comparing with the results from $V_2O_5$ or the mixture layer, also prepared by co-deposition of $V_2O_5$ and the organic hole-transporting compound, having been already disclosed in the prior invention by the inventors. The measurement of the resistivity (unit: Ωcm) was carried out with the following two methods depending on the values (range) of the resistivity of the substance to be tested (hereinafter, test substance).

The first measurement method (sandwich method) is a method suitable for the substances having a relatively high resistivity. The measurement of the resistivity is carried out by sandwiching a deposited thin layer 103 of the test substance in between two electrodes 101 and 102 (the resistivity evaluation device having a sandwich structure shown in FIGS. 2 and 3). The resistivity is calculated from a ratio of the electric field E (V/cm), obtained from an applied voltage (V) and a layer thickness (cm) of the deposited thin layer of the test substance (i.e., distance between the electrodes), and a current density ($A/cm^2$) obtained from a measured current value (A) and a cross-sectional area ($cm^2$) of the current flowing region [(V/cm)/($A/cm^2$)=(Ωcm)].

Figure 2:
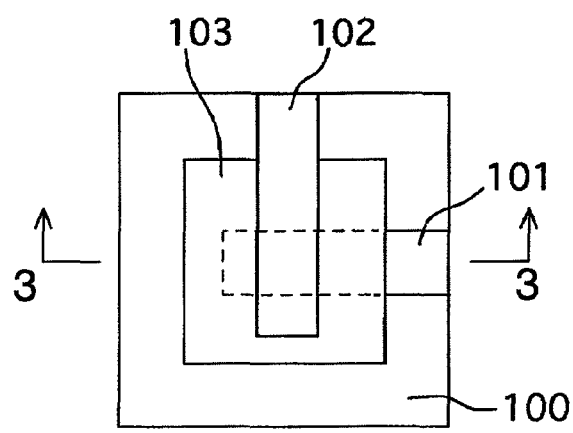
FIG. 2 is a plane view showing the resistivity evaluation device used in the sandwich method.
Figure 3:
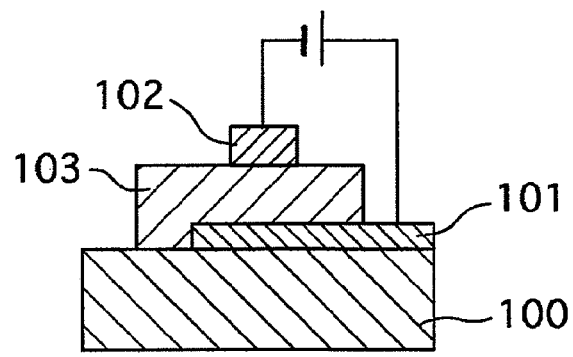
FIG. 3 is a cross-sectional view of the device taken along line 3-3 of FIG. 2.

FIG. 2 is a plane view showing the resistivity evaluation device used in the sandwich method and FIG. 3 is a cross-sectional view of the resistivity evaluation device. More specifically, the resistivity evaluation device is produced by depositing a test substance 103 at a desired thickness on an ITO electrode 101 (having a width of 2 mm, or if necessary, on an aluminum electrode having a width of 2 mm) formed over the substrate 100 and finally depositing an aluminum electrode 102 (having a width of 2 mm as in the ITO electrode) in such a manner that the aluminum electrode stripe 102 intersects orthogonally the ITO electrode stripe 101, as shown in FIG. 2.

Figure 4:
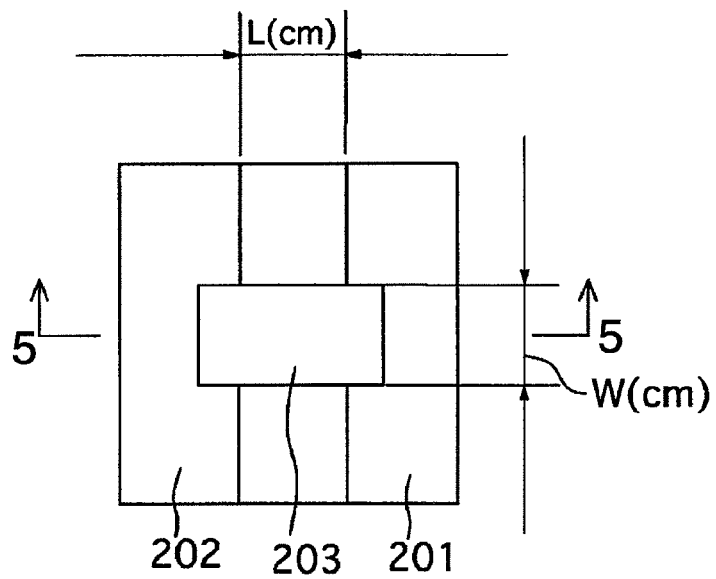
FIG. 4 is a plane view showing the resistivity evaluation device used in the co-planar arrangement method.
Figure 5:
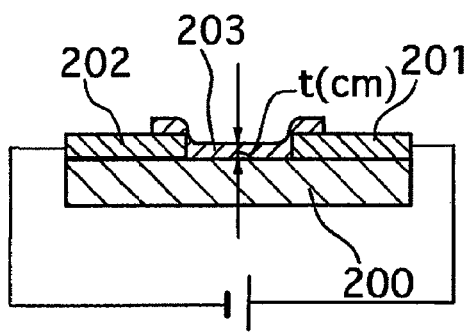
FIG. 5 is a cross-sectional view of the device taken along line 5-5 of FIG. 4.

The second measurement method (co-planar arrangement method) is a method suitable for the substances having a relatively low resistivity, and the resistivity is measured using a resistivity evaluation device having a co-planar arrangement structure. Namely, as shown in FIGS. 4 and 5, a substrate 200 having anode 201 and cathode 202 layers disposed at a certain distance L (cm) on its surface is prepared, first. And then, test substance 203 is deposited, through a metal mask for defining a deposition area having a certain opening width W (cm), onto the substrate 200 to form a deposited layer having the predetermined thickness t (cm). In this method, an electric field E (V/cm) applied to the test substance is calculated by dividing an applied voltage (V) by a distance L (cm) between the electrodes, and a current density ($A/cm^2$) is calculated by dividing a measured current value (A) by a cross-sectional area of the current flowing region [in this example, W×t ($cm^2$)]. The resistivity (Ωcm) of the test substance is calculated from the resulting values as in the manner described above with regard to the first measurement method (sandwich method).

Figure 6:
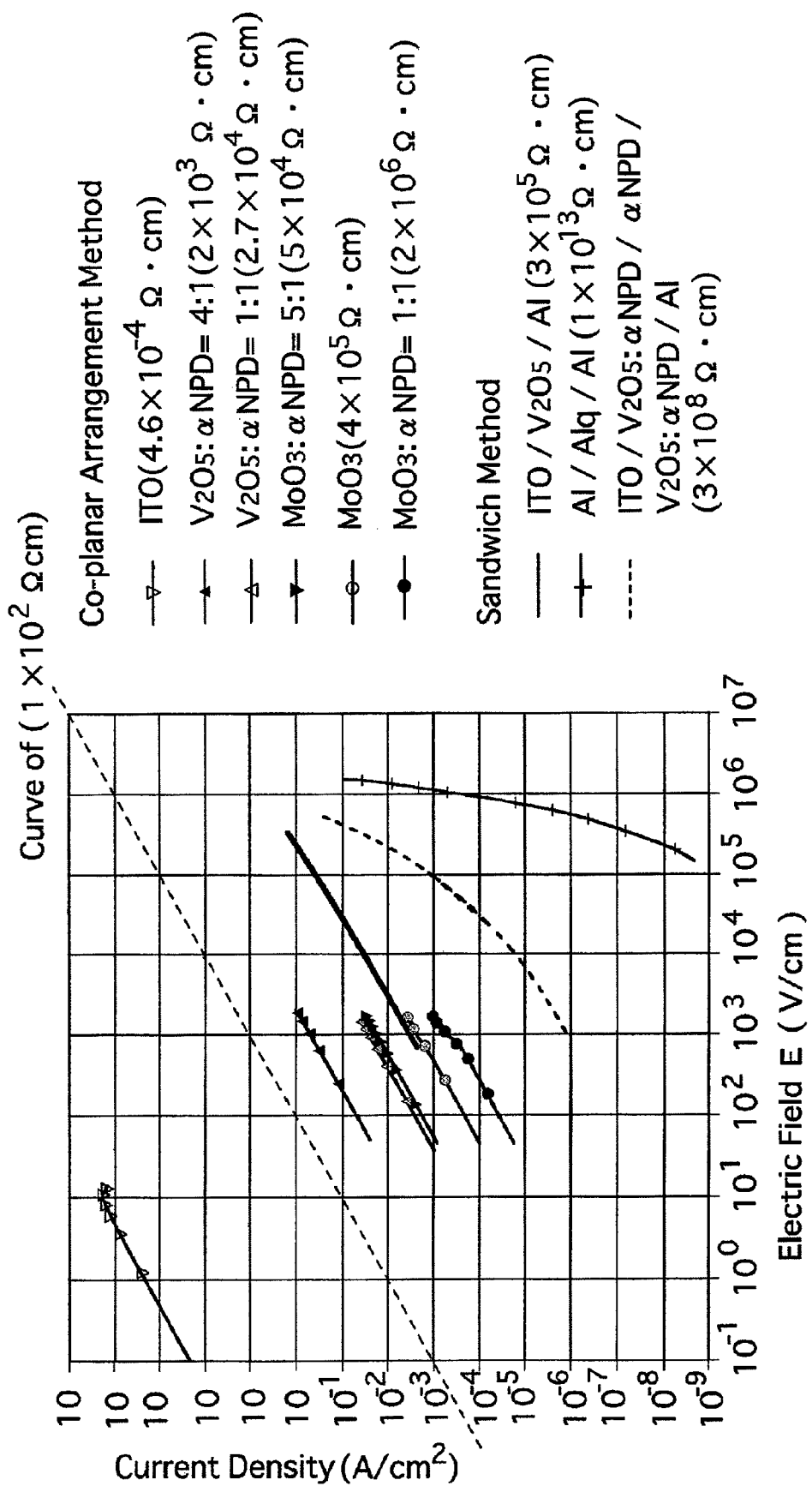
FIG. 6 is a characteristic curve showing the relationship between the current density (A/cm2) and the electric field (V/cm) characteristics in Example 2.

The measurement results of the resistivity are plotted in FIG. 6. The test substances used herein are "ITO (transparent electrode material) layer", "$V_2O_5$ layer", "co-deposition layer of $V_2O_5$ and α-NPD", "$MoO_3$ layer", "co-deposition layer of $MoO_3$ and α-NPD", "Alq (light emissive material as well as electron-transporting material) layer" and "α-NPD layer". The resistivity of each of the "ITO layer", "co-deposition layer of $V_2O_5$ and α-NPD", "$MoO_3$ layer" and "co-deposition layer of $MoO_3$ and α-NPD" is measured using the co-planar arrangement structure. The resistivity of each of the "$V_2O_5$ layer", the "α-NPD layer" and the "Alq layer" is measured using the sandwich structure. Furthermore, as to the measurement of the α-NPD, to ensure an ohmic charge injection from the electrodes, both the portions adjacent to the electrodes are formed by depositing the co-deposited mixture layer of $V_2O_5$ and α-NPD of 50 Å thick, then pure α-NPD layer of 1,000 Å-thick is deposited (leading to the α-NPD layer sandwiched by that mixture layers backed by the electrode layer on both sides), as designated in FIG. 6.

The resistivity value (Ωcm) obtained for each of the deposited layers plotted in FIG. 6 is as follows.

[Co-Planar Arrangement Method]
- - -: ITO layer,
    $4.6×10^{-4}$ Ωcm
- ▲-: co-deposition layer of $V_2O_5$ and α-NPD ($V_2O_5$:α-NPD=4:1, molar ratio),
    $2.0×10^3$ Ωcm
- - -: co-deposition layer of $V_2O_5$ and α-NPD ($V_2O_5$:α-NPD=1:1, molar ratio),
    $2.7×10^4$ Ωcm
-▼-: co-deposition layer of $MoO_3$ and α-NPD ($MoO_3$:α-NPD=5:1, molar ratio),
    $5.0×10^4$ Ωcm
-○-: $MoO_3$ layer,
    $4.0×10^5$ Ωcm
-●-: co-deposition layer of $MoO_3$ and α-NPD ($MoO_3$:α-NPD=1:1, molar ratio),
    $2.0×10^6$ Ωcm

Figure 7:
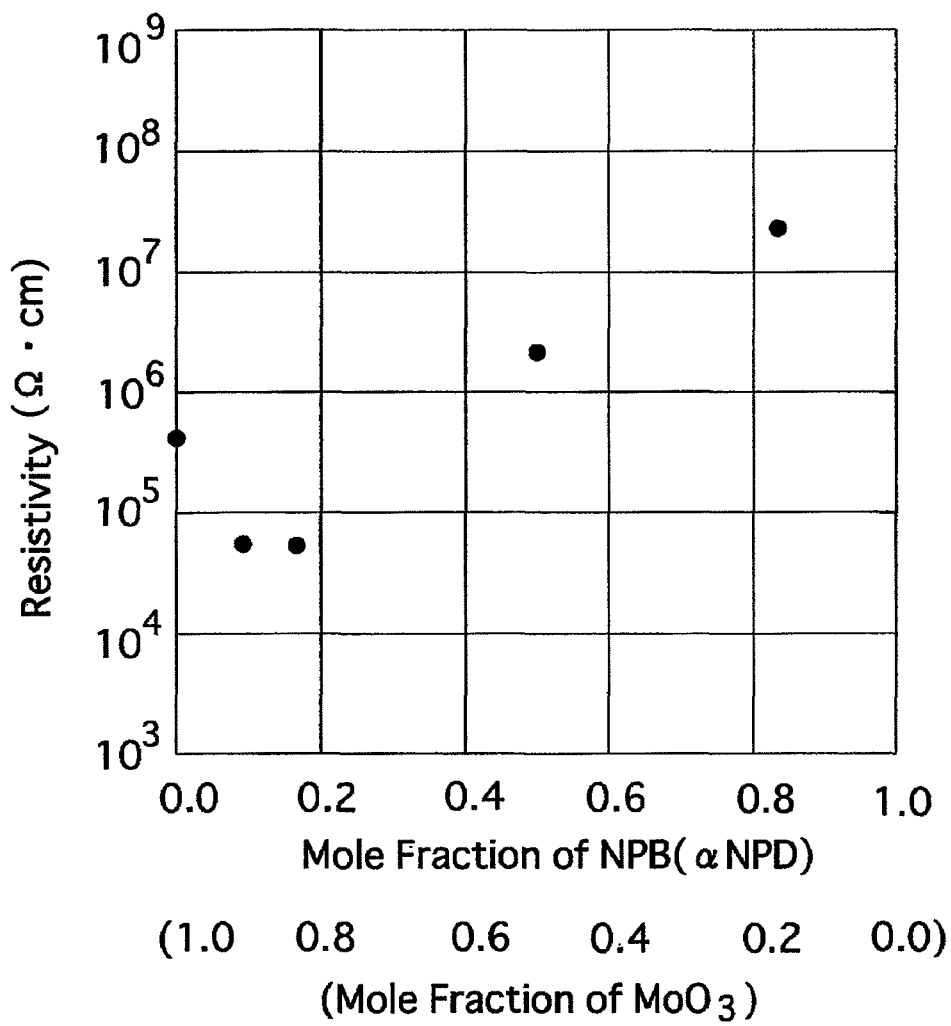
FIG. 7 is a graph showing the relationship between the mixing ratio (mole fraction) in the co-deposited film of $MoO_3$ and α-NPD and resistivity (Ωcm) in Example 2.

[Sandwich Method]
Heavy Line: $V_2O_5$ layer (100 nm) (determined at the laminated structure: ITO/$V_2O_5$/Al),
    $3.0×10^5$ Ωcm
Thin Line: Alq layer (300 nm) (determined at the laminated structure: Al/Alq/Al),
    $1.0×10^{13}$ Ωcm Chain Line: α-NPD (NPB) layer (100 nm) (determined at the laminated structure: ITO/V$_2$O$_5$:α-NPD(5 nm)/α-NPD (100 nm)/V$_2$O$_5$:α-NPD(5 nm)/Al, 3.0×10$^8$ Ωcm In addition, the relationship between the mixing ratio (mole fraction) in the co-deposition layer consisting of MoO$_3$ and α-NPD and the resistivity measured at the each ratio is plotted in the graph of FIG. 7. As is shown in FIG. 7, it is observed that when α-NPD (having a resistivity of not less than 10$^8$ Ωcm) is added to a layer of MoO$_3$ having a resistivity of around 10$^5$ Ωcm (if it is solely used), the resistivity of the mixed layer can be once reduced to a level of about 10$^4$ Ωcm (contrary to the general expectation), when the mole fraction of α-NPD in the mixed layer is about 0.1 to 0.2. This phenomenon can be identified with the relationship between the mixing ratio (mole fraction) in the co-deposition layer of V$_2$O$_5$ and α-NPD and the resistivities for each ratio reported by the inventors of the present invention in Japanese Laid-open Patent Application No. 2003-272860.

Example 3

In Example 3, the measurements of the transmittance (at 1000 Å thick=100 nm thick) in the visible light wave length region were conducted for the main constituents of the present invention, i.e., "MoO$_3$ deposition layer" and "co-deposited layer of MoO$_3$ and α-NPD", and for the "V$_2$O$_5$ deposition layer" which can function similar way in the organic devices.

Figure 8:
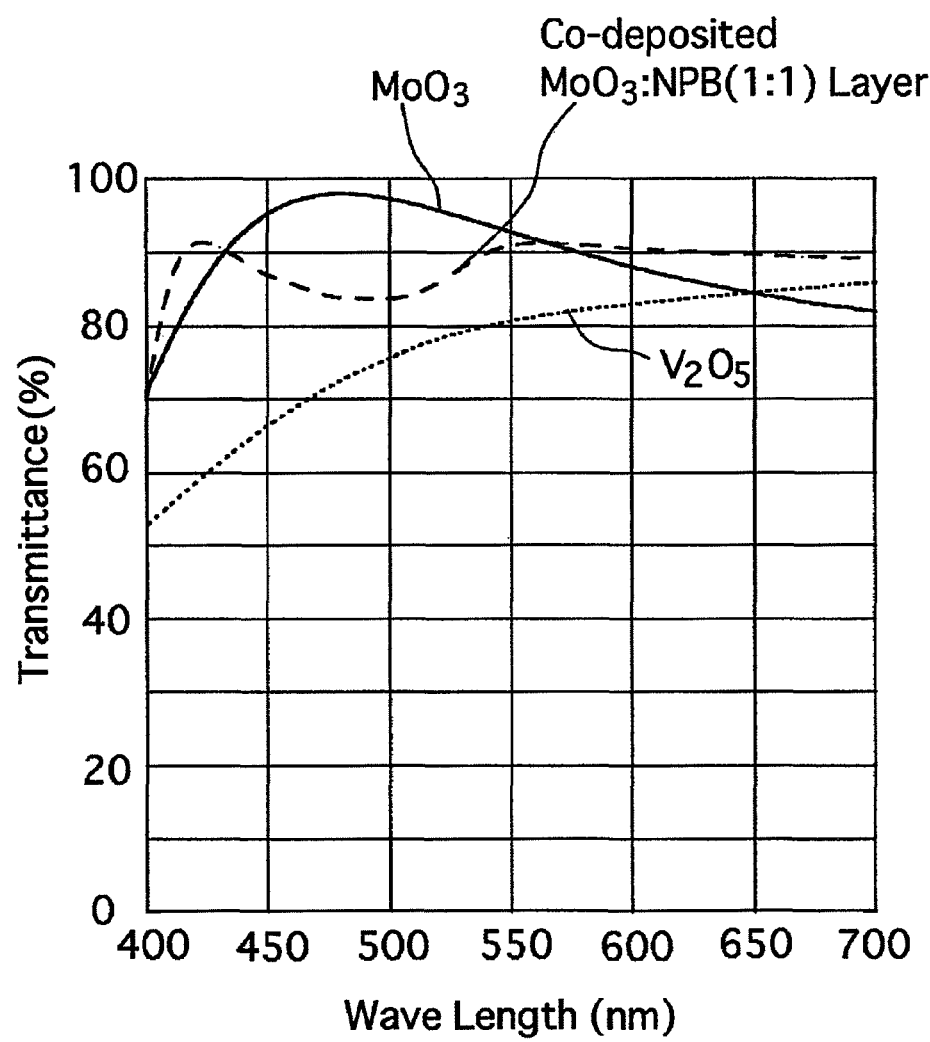
FIG. 8 is a graph showing the measurement results of the transmittance (%) in a visible light region of each film in Example 3 in which the abscissa axis represents a wavelength (nm) of the light.

Measurement results are plotted in FIG. 8. As can be understood from FIG. 8, it has been found that the "MoO$_3$ deposition layer" and "co-deposited layer of MoO$_3$ and α-NPD" of the present invention can exhibit a higher transmittance in a substantially full range of the visible light region in comparison with the "V$_2$O$_5$ deposition layer". Accordingly, it can be appreciated that the above layers of the present invention can be more advantageously used as a layer for an organic device such as an organic EL element and an organic solar cell.

Hereinafter, the organic EL element and an organic solar cell will be specifically described as an example of the organic device to assist in further understanding of the present invention. Note that, in the following examples, ITO: indium-tin-oxide is used in the formation of an anode, and CuPc: copper phthalocyanine is used in the formation of a hole-transporting layer adjacent to an anode or an electron-donating layer of the organic solar cell. PTCBI:3,4,9,10-perylenetetracarboxylic bis-benzimidazole is used in the formation of an electron-accepting layer of the organic solar cell. Furthermore, NPB(α-NPD):N,N'-di(naphthalene-1-yl)-N,N'-diphenylbenzidin is used as an organic hole-transporting compound, and Alq:tris(8-hydroxyquinoline)aluminum (III) is used as a host material of the light emissive layer plus an organic electron-transporting compound. C545T (coumarin derivative, commercial product of Kodak) is a green light emissive material, and is doped into a host material of the light emissive layer. Liq:(8-hydroxyquinoline) lithium is a material used in the electron-transporting layer, and is used as a radical anion generating means for producing a radical anion of the organic electron-transporting compound (e.g., Alq), because Li ions in Liq are reduced by a thermally reducible metal (e.g., aluminum) to Li metal (that, then, would be followed by the oxidation reduction reaction leading to the formation of {Li$^+$+Alq$^-$}, for instance). Furthermore, Al: aluminum is used as a cathode or a thermally reducible metal. MoO$_3$: molybdenum trioxide is used as a radical cation generating means to produce a radical cation of the organic hole-transporting compound through contacting MoO$_3$ with an organic hole-transporting compound upon lamination or mixing thereof. In addition, MoO$_3$ may be used alone as a charge-transporting layer because of the low resistance property due to the low resistivity of not more than 10$^5$ Ωcm which is much lower than most of organic compounds used in the conventional organic devices, and because of the high light transmissivity.

Example 4

Example 4 represents an example of the embodiment in which MoO$_3$ and NPB are mixed to obtain the function as a hole-transporting layer of the organic EL device.

A layer including a mixture of NPB(α-NPD) and MoO$_3$ in a molar ratio of 1:1 is co-deposited at a thickness of 300 Å on an ITO (indium-tin-oxide) anode formed upon patterning on a glass substrate.

Thereafter, NPB(α-NPD) is deposited at a thickness of 500 Å. Subsequently, Alq doped with 1 wt % of the fluorescent dye:C545T is deposited to form a light emissive layer having a thickness of 500 Å. Thereafter, a layer including a mixture of Alq and Liq in a molar ratio of 1:1 is co-deposited at a thickness of 250 Å. Finally, aluminum (Al) is deposited at a thickness of 1,000 Å. Note that, in this example, Al can provide both of the functions of reducing a lithium ion (Li$^+$) in Liq to the metal Li and of acting as a cathode.

A structure of the resulting device is simply denoted as follows:
ITO/MoO$_3$:NPB(1:1),300/NPB,500/Alq:C545T(1 wt %),500/Alq:Liq,250/Al,1000 (Hereinafter, this simple denotation will be used to explain the device structure.)

In the layer of MoO$_3$:NPB(1:1), a radical cation of NPB (NPB$^+$) is generated through the following oxidation-reduction reaction.

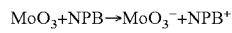

Example 5

Example 5 represents an example of the embodiment in which MoO$_3$ and NPB are laminated to obtain the function as a hole-transporting layer of the organic EL device.

A structure of the resulting device is denoted as follows:
ITO/MoO$_3$,300/NPB,500/Alq:C545T(1 wt %),500/Alq:Liq, 250/Al,1000

According to this embodiment, the formation of a radical cation (NPB$^+$) via the above-described oxidation-reduction reaction is caused in an interface between the MoO$_3$ layer and the NPB layer contacting each other.

Example 6

Example 6 represents an example of the embodiment in which a MoO$_3$ layer is formed at a thickness of 50 Å in an interface of two different hole-transporting materials, e.g., CuPc and NPB layers, to thereby diminish a hole transfer barrier as a result of the formation of radical cations of the two hole-transporting molecules adjacent to both side of the MoO$_3$ layer.

A structure of the resulting device is denoted as follows:
ITO/Cu Pc,200/MoO$_3$,50/NPB,500/Alq:C545T(1 wt %),500/Alq:Liq,250/Al,1000

Example 7

Example 7 represents an example of the embodiment in which the layer of the present invention such as MoO$_3$:NPB is used to reduce the effect of the damage induced during electrode formation by thickening the layer without suffering from undesirable voltage increase, taking advantage of remarkably low resistivity (less than $10^6$ Ωcm) characteristics of the layer of the present invention, in comparison with that (not less than $10^8$ Ωcm) of the pure organic layer.

A structure of the resulting device is denoted as follows: ITO/MoO$_3$:NPB(1:1),300/NPB,500/Alq:C545T(1 wt %),500/Alq:Liq,250/Al,15/MoO$_3$:NPB(1:1),1000/ITO or Al,1000

According to this embodiment, the MoO$_3$:NPB layer adjacent to the cathode works as the damage buffer layer to prevent the organic molecule, contacting the MoO$_3$:NPB layer on the opposite side of the cathode, from being damaged by high energy particles impinging to the organic layer during the process of the film formation of Al or ITO etc, done by sputtering, for instance.

Furthermore, the trace quantity of Al (corresponding to about 15 Å thick, in above case) deposited onto the co-deposited Alq:Liq layer play the role just for reducing a lithium ion (Li$^+$) in Liq to the metal Li. Hence Al itself is conversely fully oxidized, leading to no metal state Al remaining in the layer.

In the resulting device, the interface between the "radical anion generation layer" consisting of [Alq:Liq,250/Al,15] and "radical cation generation layer" consisting of [MoO$_3$:NPB(1:1),1000] can act as a hole current-electron current conversion layer, and electrons are moved from the hole current-electron current conversion layer to a cathode side of the device, while holes are moved to an anode side of the device.

Example 8

Example 8 has the device structure obtained by repeating the process of Example 4, i.e., the following structure:
ITO/MoO$_3$:NPB(1:1),300/NPB,500/Alq:C545T(1 wt %),500/Alq:Liq,250/Al,15/MoO$_3$:NP B(1:1),100/NPB,500/Alq:C545T(1 wt %),500/Alq:Liq,250/Al,1000

In this embodiment, as in the embodiment of Example 7 described above, the laminated portion "Alq:Liq,250/Al,15/MoO$_3$:NPB(1:1),100" can act as a hole current-electron current conversion layer. Furthermore, since the conversion layer also can act as a "charge generation layer" in the multi-photon emission organic EL device having two light emissive units, it becomes possible to obtain approximately doubly higher quantum efficiency when compared with the device produced in Example 4.

Example 9

Example 9 represents an example of the organic solar cell in which two heterojunction structures (CuPc/PTCBI) are connected in series, i.e., the solar cell has the following structure:
ITO/MoO$_3$:CuPc(5:1),100/CuPc,300/PTCBI,150/Alq:Liq:Al(1:1:1),600/MoO$_3$:CuPc(5:1), 100/CuPc,300/PTCBI,150/Alq:Liq:Al(1:1:1),600/Al In this embodiment, since the above-described portion "Alq:Liq:Al(1:1:1),600/MoO$_3$:CuPc(5:1),100" can act as a connector layer for connecting the two heterojunction structures in series, it becomes possible to obtain open-circuit voltage being approximately twice of that of a conventional organic solar cell having only one heterojunction structure.

Note that in this example, the ternary deposition technique of three components: Alq, Liq and Al by mixing them in an approximate molar ratio (Alq:Liq:Al=1:1:1) to form a radical anion (Alq$^-$) state of Alq is described in detail in Japanese Patent Application No. 2003-380338 by the inventors of the present invention.

Example 10

Example 10 has a device structure similar to that of Example 7 except that the co-deposited MoO$_3$:NPB layer adjacent to the cathode was replaced with the pure MoO$_3$ layer, i.e., having the following structure:
ITO/MoO$_3$:NPB(1:1),300/NPB,500/Alq:C545T(1 wt %),500/Alq:Liq,250/Al,15/MoO$_3$,x (Å)/ITO or Al,1000

In this device, electrons are injected from the radical anion generation layer (Alq:Liq,250/Al,15) to an anode layer of the device. Accordingly, as in Example 3, the MoO$_3$ layer can act as an optical path length adjustment layer when the layer thickness is x (Å), taking advantage of the good transparency of the MoO$_3$ layer. Also, as in Example 7, the MoO$_3$ layer can act as a process damage reduction layer during electrode deposition.

Example 11

Example 11 has a device structure similar to that of Example 5 except that the layer is laminated reversely, starting from the cathode layer, i.e., with the following structure:
ITO/Alq:Li,100/Alq:C545T(1 wt %),500/NPB,500/MoO$_3$,250/Al,1000

In this device structure, ITO formed over the substrate can act as a cathode. As a layer adjacent to the ITO cathode includes Li metal mixed with an Alq molecule (Alq:Li=1:1, molar ratio), the layer can act as an electron injection layer, because the Li metal can reduce Alq, leading to the corresponding radical anion state (Alq$^-$). Note that aforementioned layer, having three components: Alq, Liq and Al which are mixed in an approximate molar ratio (Alq:Liq:Al=1:1:1) to form a radical anion state (Alq$^-$) of Alq, can be alternatively used in place of the [Alq:Li=1:1] as an electron injection layer. This technique is described in detail in Japanese Patent Application No. 2003-380338 by the inventor.

Example 12

Example 12 has a device structure similar to that of Example 4 except that the layer is laminated reversely, starting from the cathode layer, i.e., with the following structure:
Al/Alq:Li,150/Alq,100/Alq:C545T(1 wt %),500/NPB,500/MoO$_3$:NPB(1:1),1000/ITO,1000

In this device structure, Al formed over the substrate can act as a cathode and light-reflecting electrode. As a layer adjacent to the Al cathode includes Li metal mixed with an Alq molecule (Alq:Li=1:1, molar ratio), the layer can act as an electron injection layer, because the Li metal can reduce Alq, leading to the corresponding radical anion state (Alq$^-$). Of course, the ternary deposition process aforementioned in Example 11 (i.e., disclosed in Japanese Patent Application No. 2003-380338) can be alternatively used as well.

ITO (anode) is deposited by sputtering on the co-deposited MoO$_3$:NPB layer that works as a hole-injection layer. Besides, the co-deposited MoO$_3$:NPB layer can also act as a process damage reduction layer during electrode deposition as in Example 7.

It should be noted that in the examples described above, the present invention should not be restricted to the substances or the layer thickness used in the examples. Well-known substances and newly developed suitable substances can be appropriately used, and also the layer thicknesses can be appropriately varied to obtain an optimum device property.

Furthermore, the above-described examples are characterized in that $MoO_3$ was used in place of FeCl3, $V_2O_5$, F4-TCNQ and other electron-accepting substances, use of which were disclosed by the inventors of the present invention in Japanese Laid-open Patent Application Nos. 11-251067 (U.S. Pat. No. 6,423,429), 2001-244079 (U.S. Pat. No. 6,589,673), 2003-272860, and Japanese Patent Application Nos. 2003-358402, 2003-380338 and 2003-384202. The overall characteristics of each device in the examples of the present invention are almost comparable to those of the devices described in the above prior patent references, however, $MoO_3$ can be more suitably used in a wide variety of organic devices, because it has a higher transparency and is less toxic to the human body than the materials like FeCl3, $V_2O_5$, and F4-TCNQ cited in prior technologies.

As will be appreciated from the foregoing descriptions, according to the present invention, the prior technologies having been developed by the inventors of the present invention, in which a combination of $V_2O_5$ and an organic hole-transporting compound was used to form a layer constituting the organic device, are basically applied to the practice of the present invention without any substantial modification. However, unexpectedly, comparable results could be obtained in the present invention replacing the "combination of $V_2O_5$ and an organic hole-transporting compound" with a "combination of $MoO_3$ and an organic hole-transporting compound". Furthermore, $MoO_3$ proved to be more preferable in a point of view regarding safety since it is less toxic to the human body, along with better light transmissivity. Accordingly, in the practice of the present invention, in principle, $MoO_3$ can be utilized in all of the technologies which were disclosed by the inventors regarding the use of an electron-accepting substance such as $V_2O_5$ (i.e., Lewis acid). Moreover, a mixed layer of $MoO_3$ and the organic hole-transporting compound can exhibit an absorption peak in a near-infrared region around the wavelength of 800 to 2,000 nm, which is a profound proof of electron transfer between them and is never seen when each substance (i.e, $MoO_3$ or hole-transporting compound) is solely measured.

In other words, $MoO_3$ and the organic hole-transporting compound can form a charge transfer complex resulting from the oxidation-reduction reaction (donation and acceptance of electrons) between the two compounds. In this reaction process, the organic hole-transporting compound is converted to the state of radical cations, and thus it can act as an internal carrier that can move in the organic layer upon voltage application.

Hereinabove, the present invention was described with reference to the examples thereof, however, it is noted that the present invention should not be restricted to these examples and any improvement or modification may be applied to the present invention for the purpose of improvement or within the spirit of the present invention.

What is claimed is:
1. An organic device having a layer structure on a substrate in the following deposition sequence:
(A) an anode;
(B) a substantially transparent anode-adjacent layer consisting of a mixture of $MoO_3$ and an organic hole-transporting molecule;
(C) a layer structure mainly consisting of organic compounds;
(D) a cathode layer;
wherein the substantially transparent anode-adjacent layer consisting of the mixture of the $MoO_3$ and the organic hole-transporting molecule is prepared via resistive heating method,
wherein the $MoO_3$ and the organic hole-transporting molecule in the substantially transparent anode-adjacent layer forms the charge transfer complex, thus the organic hole-transporting molecule is in the state of radical cations, forming the charge transfer complex contained layer,
wherein the organic hole-transporting molecule consists essentially of alpha-NPD, and
wherein the substantially transparent anode-adjacent layer consisting of the $MoO_3$ and the organic hole-transporting molecule is deposited in a ratio of 5:1.
2. An organic device having a layer structure on a substrate in the following deposition sequence:
(A) a cathode layer;
(B) a layer structure mainly consisting of organic compounds;
(C) a substantially transparent anode-adjacent layer consisting of a mixture of $MoO_3$ and an organic hole-transporting molecule consisting essentially of alpha-NPD;
(D) an anode layer;
wherein the substantially transparent anode-adjacent layer consisting of the mixture of the $MoO_3$ and the organic hole-transporting molecule is prepared via resistive heating method deposited in a molar ratio of 5:1, and,
wherein the $MoO_3$ and the organic hole-transporting molecule in the substantially transparent anode-adjacent layer forms the charge transfer complex, thus the organic hole-transporting molecule is in the state of radical cations, forming the charge transfer complex contained layer.

* * * * *